United States Patent [19]
Wen

[11] Patent Number: 5,877,055
[45] Date of Patent: Mar. 2, 1999

[54] METHOD FOR FABRICATING MULTI-STAGE ROM STRUCTURE

[75] Inventor: Jemmy Wen, Hsinchu, Taiwan

[73] Assignee: United Microelectronics Corp., Taiwan

[21] Appl. No.: 839,598

[22] Filed: Apr. 15, 1997

[30] Foreign Application Priority Data

Dec. 9, 1996 [TW] Taiwan .................................. 85115225

[51] Int. Cl.$^6$ .............................................. H01L 21/8246
[52] U.S. Cl. ........................................... 438/276; 438/270
[58] Field of Search ................................... 438/270, 275, 438/276, 277, 278, 282, 289, 291

[56] References Cited

U.S. PATENT DOCUMENTS

| | | | |
|---|---|---|---|
| 5,021,355 | 6/1991 | Dhong et al. ............................ | 438/270 |
| 5,504,025 | 4/1996 | Fong-Chun et al. .................... | 438/270 |
| 5,595,927 | 1/1997 | Chen et al. .............................. | 438/270 |
| 5,627,091 | 5/1997 | Hong ....................................... | 438/276 |

Primary Examiner—Chandra Chaudhari
Attorney, Agent, or Firm—Finnegan, Henderson, Farabow, Garrett & Dunner, L.L.P.

[57] ABSTRACT

A multi-stage read only memory (ROM) device and a method for fabricating the same. The device includes a source/drain pole and a gate in a trench, wherein the gate intersects the source/drain pole at an angle to form a number of memory cells. The fabrication of the multi-stage ROM includes two encoding processes. The first encoding process includes implantation of impurity ions in a portion of memory cells to adjust the threshold voltage, so that some of the memory cells have a first threshold voltage and the others have a second threshold voltage. The second encoding process includes forming a number of dielectric remainders at the bottom of the gate trench of a portion of the memory cells, so that some of the memory cells have a first effective channel width and the others have a second effective channel width. As a result, the memory cells of a ROM are of four types with different combinations of threshold voltages and effective channel widths.

11 Claims, 8 Drawing Sheets

METHOD FOR FABRICATING MULTI-STAGE ROM STRUCTURE

BACKGROUND OF THE INVENTION

1. Field of the Invention

The invention relates in general to a structure of a multi-stage read only memory (ROM) and a method of fabricating the same, and more particularly to a structure of a multi-stage ROM including memory cells with different threshold voltages and different effective channel widths and a method of fabricating the same.

2. Description of the Related Art

Read only memory (ROM) has been widely used in minicomputers, microprocessors and other digital hardware similar in kind. A ROM can be used to store information of a system, for example, a basic input output system (BIOS). Because of the complexity of processes for manufacturing ROM, much time is spent in each of the manufacturing steps and the pretreatment. Therefore, customers usually deliver programming data to the factory for fabricating the ROMs, where partially completed ROMs are programmed to produce a finished product.

Because most devices of a ROM have the same structure, except for data stored in the programming step, in most integrated circuit (IC) factories, mask ROMs are partially produced without performing programming, and are stocked. After receiving an order for special programming from a customer, a mask is produced to perform a programming step and finish the production, so that the lead time can be reduced to bring better service to customers. Therefore, post-programmed mask ROM is commonly used in the art.

Figure 1:
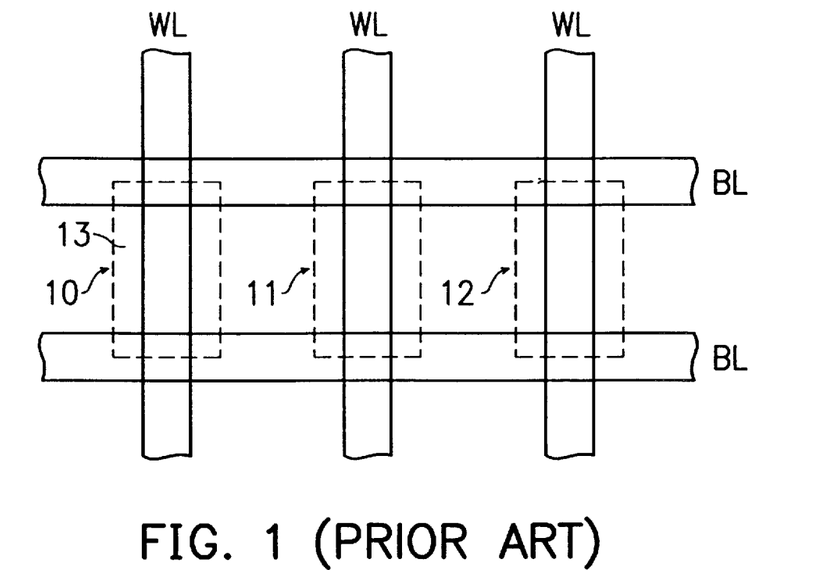
FIG. 1 (Prior Art) is a top view showing the layout of conventional memory cells of a ROM.

Generally, a channel transistor is used as a memory cell for ROM. In the programming process, a number of channel transistors have impurities selectively implanted into specific channel regions to modify the threshold voltages of the transistors. In this way, the conductivity of the memory cells can be controlled. FIG. 1 is a top view of the integrated circuit layout of memory cells labeled 10, 11, 12 in a ROM. A polysilicon word line (WL) bestrides a polysilicon bit line (BL). The channel 13 of the memory cell 10 is formed under the word line and between the bit lines. The data in binary form is stored in the memory cell by the implantation of impurities in the channel 13.

Figure 2:
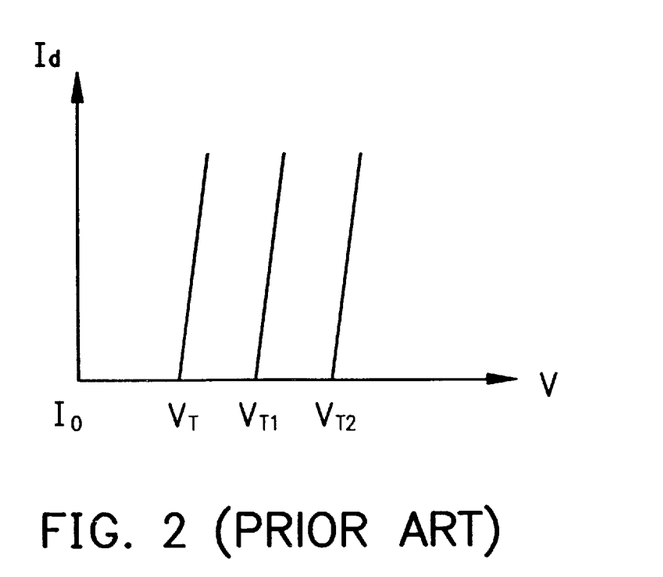
FIG. 2 (Prior Art) is a plot of the relationship of the threshold voltage and the drain current for different memory cells, wherein different threshold voltages and drain currents are generated by an implanting technique for specific channel regions.

Presently, for multi-stage read only memory, double code implanting is used to produce different threshold voltages of memory cells to construct a multi-stage logic stage. As shown in FIG. 2, the memory cells are provided with different threshold voltages $V_T$, $V_{T1}$, $V_{T2}$ by implanting ions into specific channel regions.

The conventional ROM described above makes use of different threshold voltages to control the logic state of the memory cell simply by implanting ions into the specific channel regions. Because of the capacity limitation of binary programming and the difficulty increasing the density of cells to reduce the overall footprint of the IC, performing a multi-stage process is the only way to improve the memory capacity.

SUMMARY OF THE INVENTION

It is therefore an object of the invention to provide a structure of multi-stage ROM and a method of fabricating the same. The invention makes use of different threshold voltages and different effective channel widths of memory cells to construct multi-stage logic circuits on a wafer. The invention improves the integration of ROM without miniaturizing devices, and constructs more memory cells in the same area.

The invention achieves the above-identified objects by providing a new method of fabricating a multi-stage ROM. In accordance with one preferred embodiment of the invention, a pad oxide layer is formed on a substrate of a first conductivity-type. A number of first trenches are formed in parallel on the substrate along a first direction. Then, an insulating layer is formed over the upper surface of the substrate and the first trenches. A first conductive layer of a second conductivity-type is formed over the insulating layer and so as to fill up the first trenches. The portion of the first conductive layer which is above the upper surface of the substrate is removed and the remaining portion of the first conductive layer is retained in the first trenches with a surface level lower than the upper surface of the substrate.

Then, the upper portion of the insulating layer is removed until the upper surface of the insulating layer is lower than the upper surface of the first conductive layer. A second conductive layer of the second conductivity-type is formed over the substrate and to fill up the first trenches. The second conductive layer is etched back until the upper surface of the second conductive layer has approximately the same level as the upper surface of the substrate. Now, the second conductive layer and the first conductive layer form a source/drain pole. The pad oxide layer is removed and a number of second trenches are formed in parallel on the substrate along a second direction. Thereafter, a first layer of photoresist is formed over the substrate, developed and fixed to expose the regions of a portion of the second trenches. Using the first layer of photoresist as a mask, a number of impurity diffusion regions are formed in the exposed regions by impurity doping. Then the first layer of photoresist is stripped. A dielectric layer is formed over the upper surface of the substrate and the surface of the second trenches, wherein the part of the dielectric layer at the bottom of the second trenches is thicker than the other part of the dielectric layer. The upper portion of the dielectric layer is removed until a specific thickness of the dielectric layer remains at the bottom of the second trenches and is formed into a plurality of dielectric remainders.

Thereafter, a second layer of photoresist is formed over the substrate, developed and fixed to expose a portion of the dielectric remainders. The exposed dielectric remainders are removed and the second layer of photoresist is stripped successively. A gate oxide layer is formed over the substrate. A third conductive layer is formed over the substrate to fill up the second trenches. The third conductive layer is defined by an etching technique to formed a number of gates.

The structure of multi-stage ROM according to the invention having a number of metal-oxide-semiconductor (MOS) devices includes a substrate, a number of source/drain poles, a number of impurity diffusion regions, a number of dielectric remainders, an oxide layer, and a number of gates. On the substrate, a number of first trenches extend in parallel along a first direction and a number of second trenches extend in parallel along a second direction, wherein the depth of the second trenches is shallower than the depth of the first trenches and the first direction intersects the second direction at a predetermined angle. Each of the source/drain poles applied to a bit line is formed within one of the first trenches. Each of the impurity diffusion regions is distributed on the opposite side-walls and at the bottom of a respective one of the second trenches. Each of the dielectric remainders is located at the bottom of a respective one of the second trenches. The oxide layer is deposed on the periphery and the bottom of the second trenches and on the upper surface of the substrate. Each of the gates applied to a word line is within a respective one of the second trenches having the oxide layer thereon. A portion of the oxide layer adjacent to one of the gates is U-shaped and defines a U-shaped gate oxide layer. The gates and the source/drain poles are formed into a number of memory cells. A portion of the substrate adjacent to the U-shaped gate oxide layer and between every two adjacent source/drain poles, is formed in the channel of the two adjacent source/drain poles.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 3A:
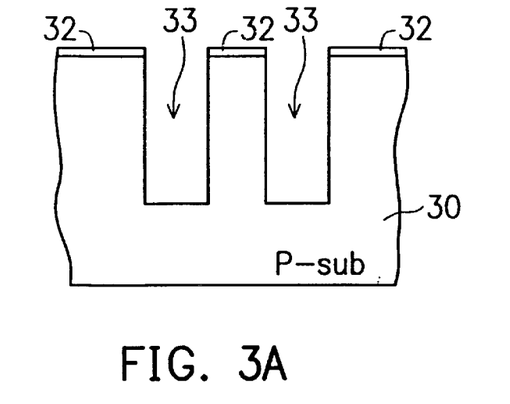
FIGS. 3A through 3K illustrate fabrication process steps of one preferred embodiment of a multi-stage ROM according to the invention.

Referring first to FIG. 3A, a substrate 30, e.g. a P-type silicon substrate, is provided. A pad oxide layer is formed over the substrate 30 by, for example, thermal oxidation. A layer of photoresist is spin-coated on the pad oxide layer (not shown in FIG. 3A), and then developed and fixed to expose a portion of the substrate on which a number of source/drain poles will be formed in. Dry etching, for example, reactive ion etching, is performed to form a number of first trenches 33 at the exposed regions of the substrate, such that the trenches are almost parallel to each other. Then the photoresist layer is stripped.

Figure 3B:
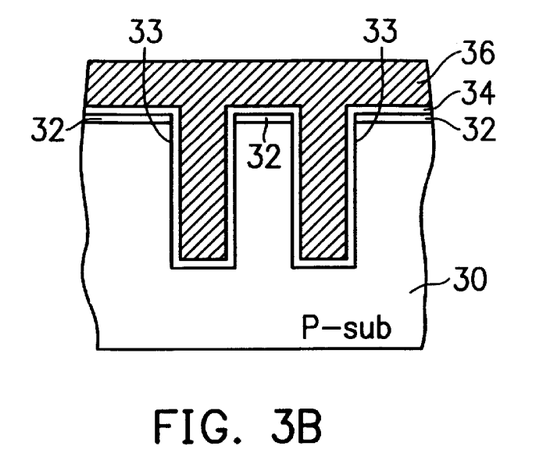

Referring to FIG. 3B, an insulating layer 34 is formed over the surface of the substrate 30 and the first trenches 33. The insulating layer 34 includes silicon oxide which is formed by oxidation. Then a first conductive layer 36 is formed over the insulating layer 34 so as to fill the first trenches 33. The first conductive layer 36 includes heavily doped polysilicon, which is formed by chemical vapor deposition (CVD).

Figure 3C:
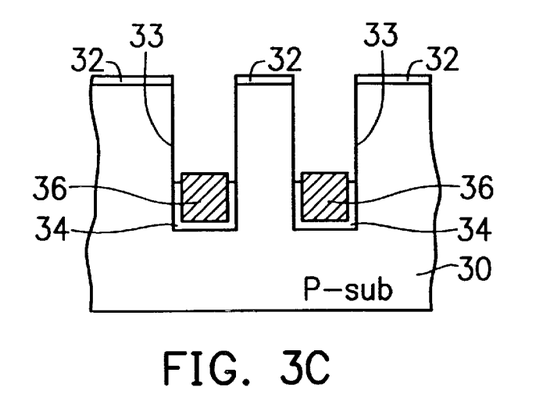

Referring to FIG. 3C, the first conductive layer 36 is dry etched until only a specific thickness of the first conductive layer 36 remains at the bottom of each of the first trenches 33. Then, the insulating layer is etched by wet etching. Because the wet etching is isotropic, when the portion of the insulating layer 34 on the upper surface is etched to expose the pad oxide layer 32, a portion of the insulating layer 34 at the side-walls of the first trenches 33 is also, at the same time etched away to expose a portion of the substrate 30. Because of the protection provided by the remainder of the first conductive layer 36 during the wet etching, the upper ends of the portion of the insulating layer 34 remaining at the bottom of the first trenches 33 are etched to a level that is lower than the upper surface of the first conductive layer 36.

Figure 3D:
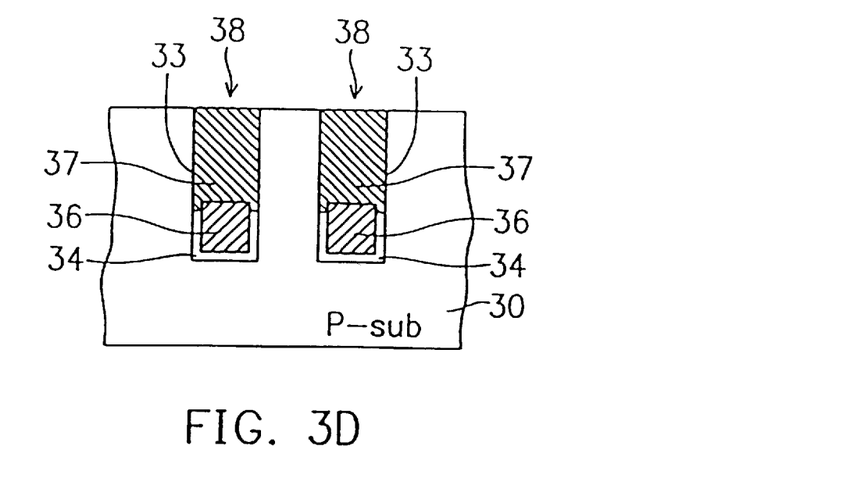

Then, referring to FIG. 3D, a second conductive layer 37 is formed over the substrate 30 so as to fill the first trenches 33. The second conductive layer 37 is then etched back until its upper surface is at the same level as the upper surface of the substrate 30. Then the pad oxide layer 32 is stripped. Thus, a number of source/drain poles 38 are formed, wherein each of the source/drain poles 38 is located within a respective one of the first trenches 33. Each of the source/drain poles 38 consists of a portion of the first and the second conductive layer 36, 37 and a portion of the insulating layer 34 located at the bottom of the source/drain pole 38 to insulate the bottom end of the source/drain pole from the substrate.

Figure 3E:
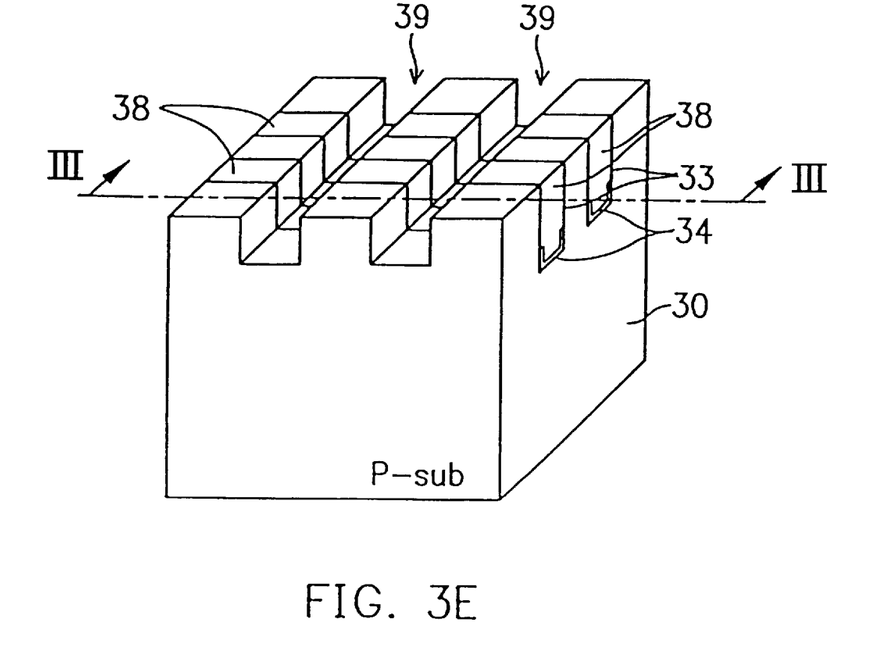

Referring to FIG. 3E, the substrate 30 is patterned using a conventional photolithography technique and dry etching, e.g. reactive ion etching, to form a number of second trenches 39 which are parallel to each other and within which the gates will be formed. The second trenches 39 intersect the first trenches 33 at a predetermined angle, for example, a right angle. The depth of the second trenches 39 is shallower than the depth of the first trenches 33. The bottom of the second trenches 39 is above the upper surface of the insulating layer 34 at the bottom of the first trenches 33 and therefore out of contact with the insulating layer 34.

Figure 3F:
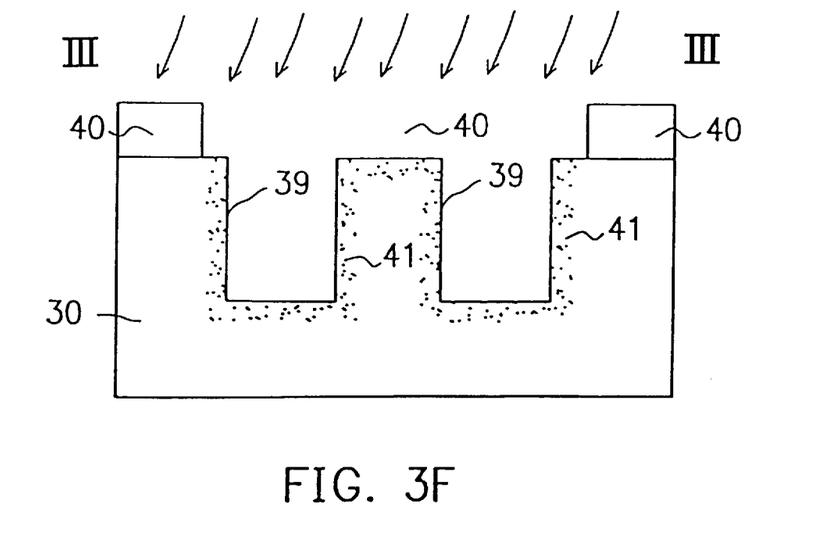

Referring to FIG. 3F, a first encoding process is performed by adjusting the threshold voltage of memory cells. FIG. 3F is a cross-section view taken along a line corresponding to the line III–III' of FIG. 3E. A photoresist layer 40 is spin-coated over the substrate 30, developed and fixed to expose a portion of the second trenches 39 and a portion of the substrate 30, whereby the exposed second trenches are prepare to be encoded. Then, impurities are implanted twice to formed an impurity diffusion region 41 on the exposed regions. The photoresist layer 40 is then stripped.

Figure 3G:
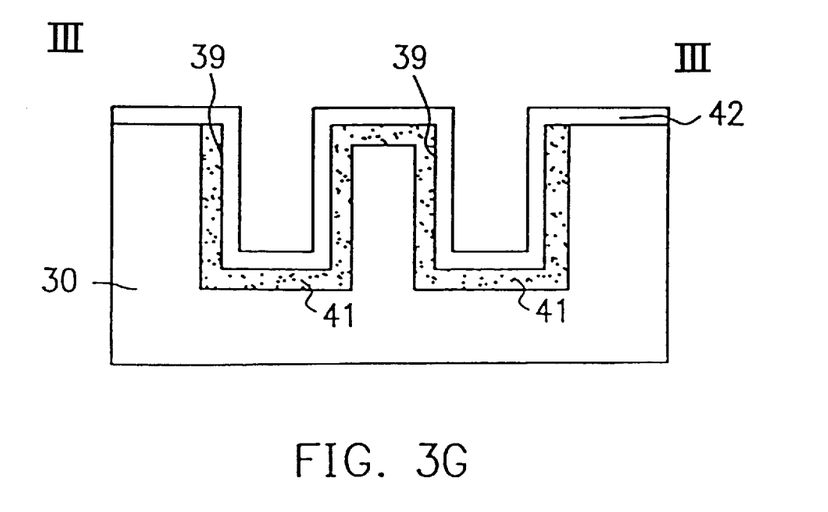
Figure 3H:
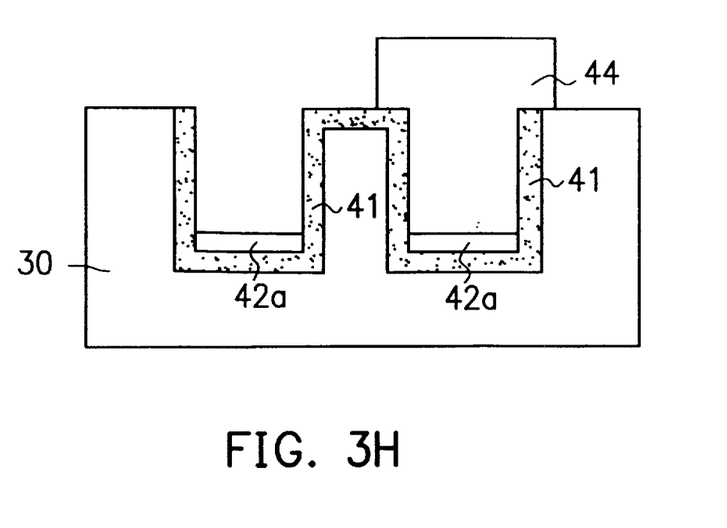
Figure 3I:
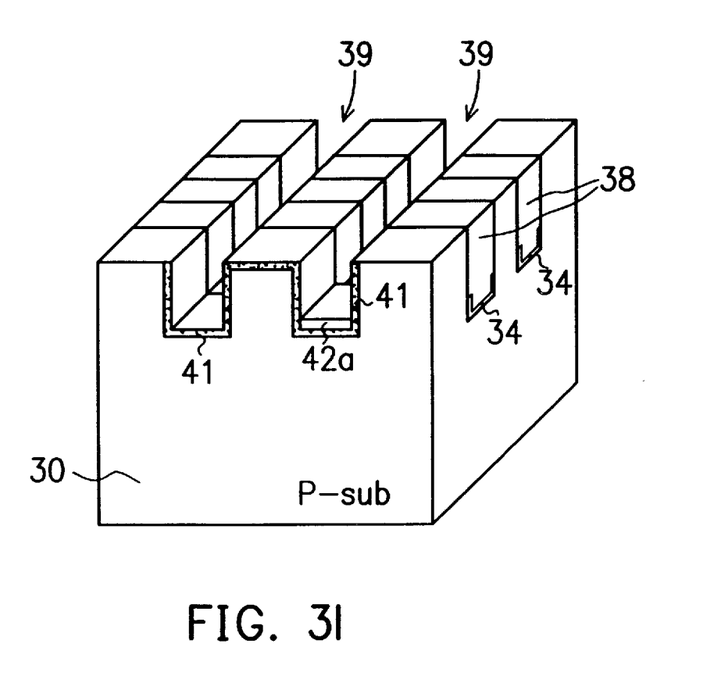

Referring to FIGS. 3G through 3I, a second encoding process is performed in which the effective channel width of the memory cells is changed. FIGS. 3G through 3I are cross-section views taken along a line corresponding to the III–III' of FIG. 3E. A dielectric layer 42, for example, silicon oxide is formed over the substrate 30 using a spin-on glass (SOG) method, wherein portions of the dielectric layer 42 at the bottom of the second trenches 39 are thicker than other portions of the dielectric layer. The dielectric layer 42 is patterned to obtain a number of dielectric remainders 42a, wherein each of the dielectric remainders 42a is located at the bottom of one of the second trenches. A photoresist layer 44 is spin-coated over the substrate 30, developed and fixed to expose some of the dielectric remainders 42a. The exposed dielectric remainders 42a are removed by, for example, wet etching. The photoresist layer 44 is then stripped. According to the processes described above, the structure shown in FIG. 3I is obtained.

Figure 3J:
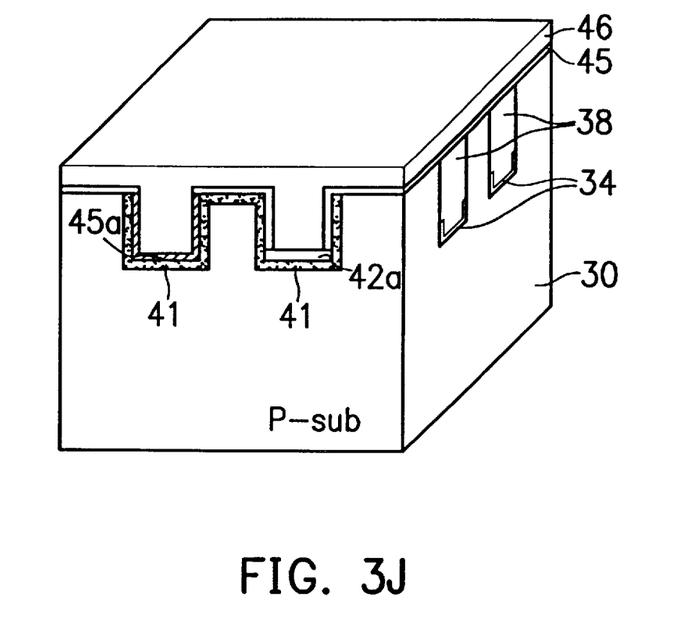
Figure 3K:
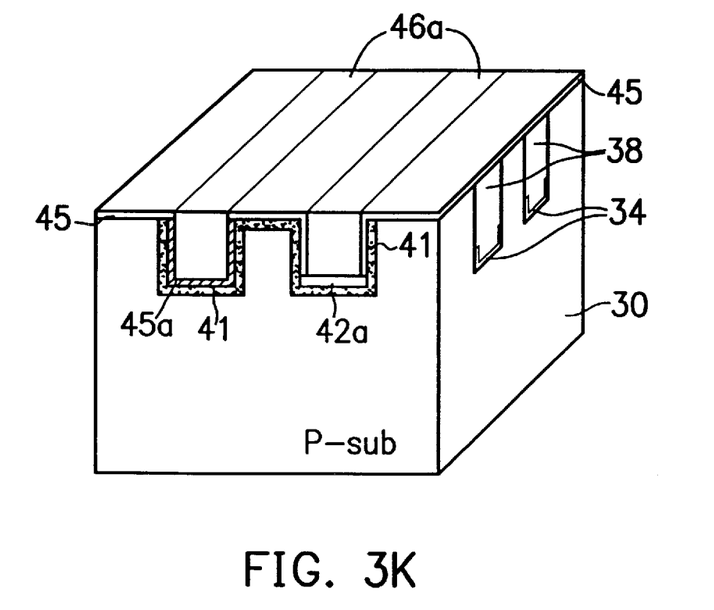

Referring to FIG. 3J, an oxide layer 45 is formed over the substrate 30 using, for example, CVD. A third conductive layer 46, for example, a layer of heavily doped polysilicon, is formed on the upper surface of the oxide layer 45 so as to fill the second trenches 39, using CVD. Referring to FIG. 3K, the third conductive layer 46 is etched back until the entire upper surface of the oxide layer 45 (outside of the second trenches 39) is exposed, wherein after the etching process, the remainder of the third conductive layer 46 continues to substantially fill the second trench 39 to define gates 46a of the resultant ROM as shown. The portion of the oxide layer 45 adjacent to each of the gates 46a is U-shaped in cross section and defines a U-shaped gate oxide layer 45a. The gates 46a and the source/drain poles 38 are formed into a number of memory cells. A portion of the substrate 30 adjacent to each U-shaped gate oxide layer 45a and between every two adjacent source/drain poles 38, is formed in the channel of the two adjacent source/drain poles 38.

Figure 4A:
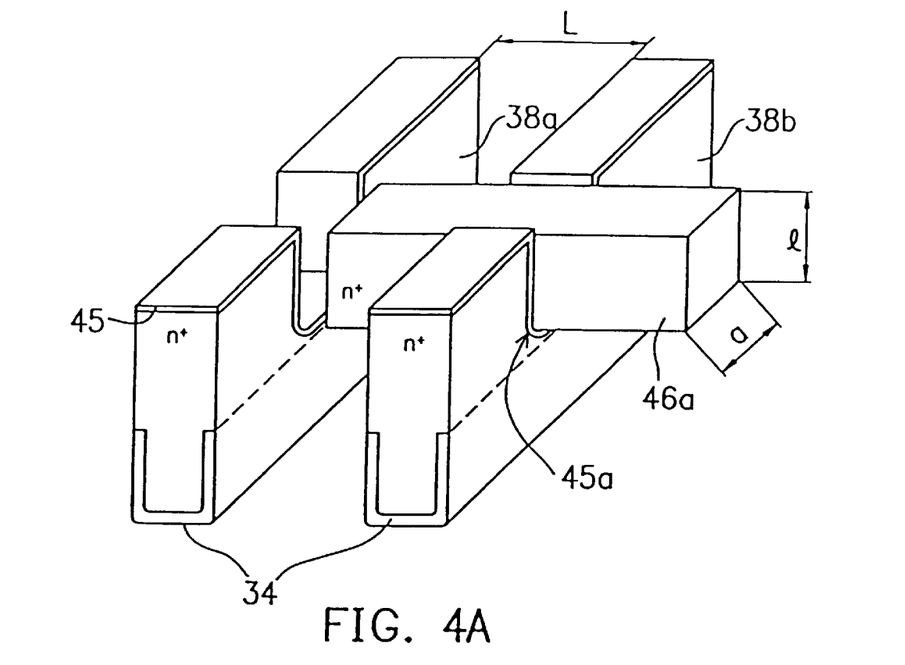
FIG. 4A is a schematic three-dimension disassembled view of a memory cell of the multi-stage ROM according to FIG. 3K.
Figure 4B:
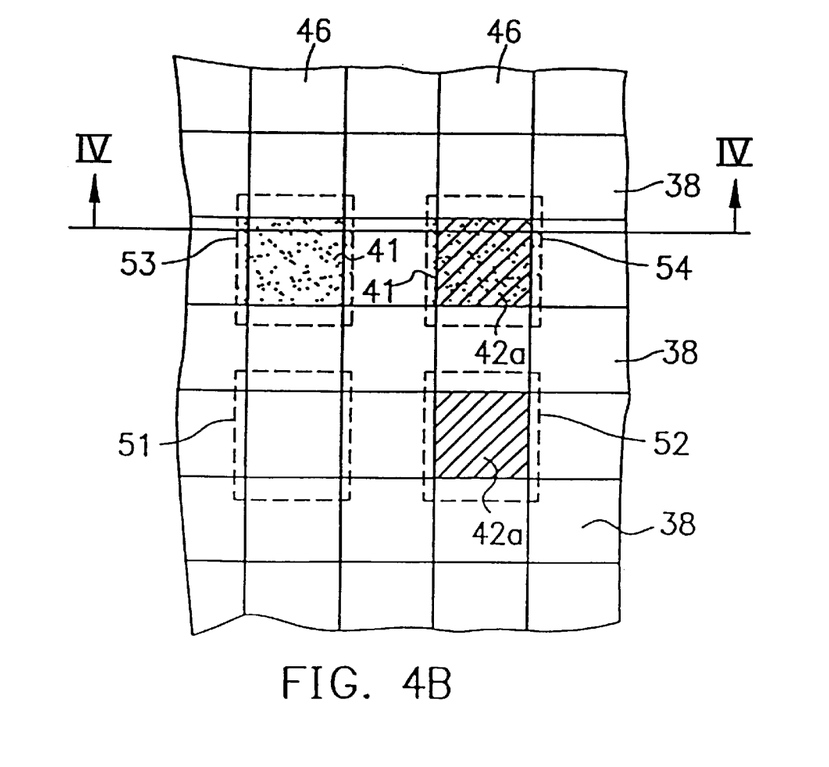
FIG. 4B is a schematic top view of the multi-stage ROM according to FIG. 3K.
Figure 4C:
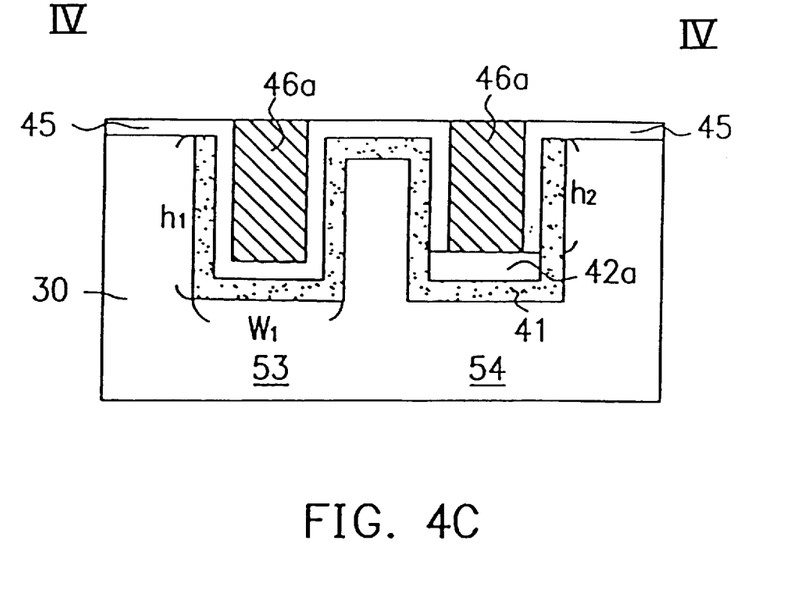
FIG. 4C is a schematic cross-sectional diagram of the multi-stage ROM according to FIG. 3K.

In order to clarify the structure of a ROM according to the invention, the structure is described with reference to FIGS. 4A through 4C. Referring to FIG. 4A, two adjacent source/drain poles 38a and 38b are shown. The channel between the source/drain pole 38a and the source/drain pole 38b has a length "L", while the gate 46 has a length "a" and a width "l". Therefore, the effective channel width, that is, the peripheral length of the U-shaped gate oxide layer 45a, is 2*l+a.

By the first and the second encoding processes, a number of memory cells which have different combinations of threshold voltages and effective channel widths are obtained. In FIG. 4B, every region outlined by a dashed line illustrates a memory cell. According to the invention, four types of memory cells are provided, including a first type memory cell 51, a second type memory cell 52, a third type memory cell 53 and a fourth type memory cell 54.

The four kinds of the memory cells now are described with reference to FIG. 4C, which is a cross-section view taken along the line IV–IV' of the structure of FIG. 4B. As described above, before the conductive layer 46 is formed, the steps of the first encoding process and the second encoding process are performed. In the first encoding process, the third type memory cell 53 and the fourth type memory cell 54 are implanted with impurity ions, that is, an impurity diffusion region 41 is formed on the periphery of selected second trenches 39 to adjust the threshold voltage of the third type memory cell 53 and the fourth type memory cell 54. The resulting threshold voltage of the third and the fourth type memory cells is $V_{T2}$, while the threshold voltage of the first and the second type memory cell is $V_{T1}$.

In the second encoding process, the second type memory cell 52 and the fourth type memory cell 54 are protected by the photoresist layer 44, so that a dielectric remainder 42a remains at the bottom of reserved second trenches 39. As FIG. 4C shows, the effective channel width of the first type memory cell 51 and the third type memory cell 53 is $2*h_1+w_1$, while the effective channel width of the second type memory cell 52 and the fourth type memory cell 54 is $2*h_2$, for the isolation of the dielectric remainder 42a. The first and the third type memory cells have a wider effective channel width than those of the second and the fourth type memory cells, so they produce a larger amount of current $I_1$, whereas the second and the fourth type memory cells, with a shallower effective channel width, produce a smaller amount of current $I_2$.

Figure 5:
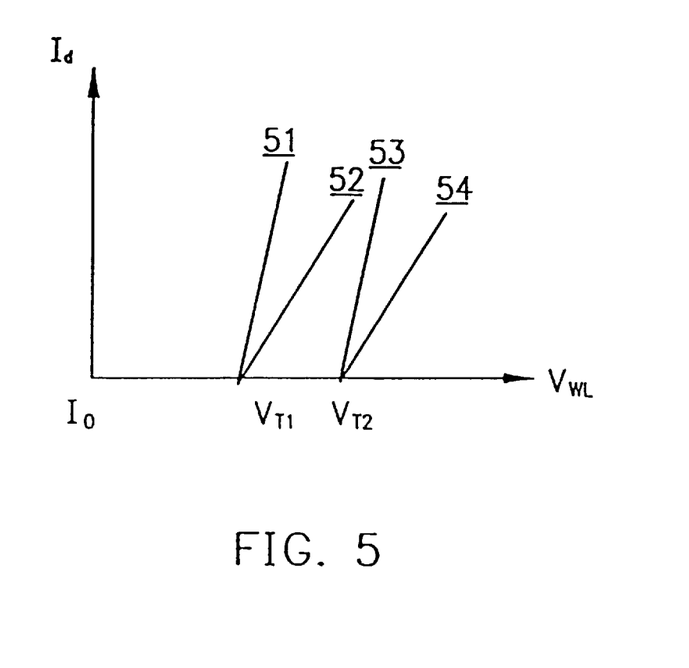
FIG. 5 is a plot of the relationship of the threshold voltages $V_{T1}$, $V_{T2}$ and the drain current for different memory cells according to a preferred embodiment of the present invention.

According to the first and the second encoding process, the permitted current and the threshold voltage of the memory cells of the four types respectively are, as shown in FIG. 5: $(I_1, V_{T1})$ for the first type memory cell; $(I_2, V_{T1})$ for the second type memory cell; $(I_1, V_{T2})$ for the third type memory cell, and $(I_2, V_{T2})$ for the fourth type memory cell. The structure of a ROM according to the invention has memory cells with different permitted currents and different threshold voltages, so it is a structure suitable for multistage logic. FIG. 5 shows graphically the relation between the gate voltage $V_{WL}$ and the drain current $I_d$ for the memory cells of the four types.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a multi-stage read only memory, comprising the steps of:

a. providing a substrate of a first conductivity-type having an upper surface, and having a pad oxide layer thereon;

b. forming a plurality of first trenches on the substrate, wherein the first trenches are substantially parallel to each other and extend in a first direction;

c. forming an insulating layer over the substrate and the first trenches;

d. forming a first conductive layer of a second conductivity-type over the insulating layer and filling up the first trenches;

e. removing a portion of the first conductive layer above the upper surface of the substrate and in the first trenches and leaving a remaining portion of the first conductive layer in the first trenches such that an upper surface of the remaining portion is below an upper surface of the substrate;

f. removing a portion of the insulating layer form the first trenches until an upper surface of the insulating layer is lower than the upper surface of the remaining portion of the first conductive layer;

g. forming a second conductive layer of the second conductivity-type over the substrate and filling up the first trenches over the remaining portion of the first conductive layer;

h. etching back the second conductive layer until the upper surface of the second conductive layer has substantially the same level as the upper surface of the substrate, wherein the etched back second conductive layer and the remaining portion of the first conductive layer form a source/drain pole;

i. removing the pad oxide layer;

j. forming a plurality of second trenches in the substrate, wherein the second trenches are substantially parallel to each other and extend in a second direction;

k. forming a first photoresist layer over the substrate, and exposing the periphery of a portion of the second trenches;

l. doping the exposed second trenches to form a plurality of impurity diffusion regions, and stripping the first photoresist layer;

m. forming a dielectric layer over the upper surface of the substrate and surface of the second trenches, wherein a portion of the dielectric layer at a bottom end of the second trenches is thicker than portions of the dielectric layer thereabove;

n. removing portions of the dielectric layer until only a plurality of dielectric remainders having a predetermined thickness remain at the bottom of the second trenches;

o. forming a second photoresist layer over the substrate and exposing a portion of the dielectric remainders;

p. removing the exposed dielectric remainders and removing the second photoresist layer;

q. forming a gate oxide layer over the substrate;

r. forming a third conductive layer over the substrate so as to fill the second trenches; and s. defining the third conductive layer so as to form a plurality of gates.

2. A method according to claim 1, wherein the first conductivity-type is P-type and the second conductivity-type is N-type.

3. A method according to claim 1, wherein the first conductivity-type is N-type and the second conductivity-type is P-type.

4. A method according to claim 1, wherein the first trenches are formed by reactive ion etching.

5. A method according to claim 1, wherein the insulating layer includes silicon oxide.

6. A method according to claim 1, wherein the first conductive layer includes a layer of heavily doped polysilicon.

7. A method according to claim 1, wherein the first direction intersects the second direction at a predetermined angle.

8. A method according to claim 1, wherein the forming of the second trenches includes reactive ion etching.

9. A method according to claim 1, wherein the depth of the second trenches is shallower than the depth of the first trenches, so that the bottom of the second trenches is above the upper surface of the insulating layer at the bottom of the first trenches, and is out of contact with the insulating layer.

10. A method according to claim 1, wherein the dielectric layer is formed by a spin-on glass method.

11. A method according to claim 1, wherein the third conductive layer includes a layer of heavily doped polysilicon.

* * * * *